United States Patent
Choi et al.

(10) Patent No.: US 12,376,240 B2
(45) Date of Patent: Jul. 29, 2025

(54) SUPPORT STRUCTURE AND DISPLAY DEVICE HAVING THE SAME

(71) Applicant: Samsung Display Co., Ltd., Yongin-si (KR)

(72) Inventors: Dongwon Choi, Seoul (KR); Jonghwa Lee, Hwaseong-si (KR); Jiyeon Kim, Hwaseong-si (KR); Taewoong Kim, Seongnam-si (KR); Tae-Ho Kim, Hwaseong-si (KR); Jin Hwan Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 318 days.

(21) Appl. No.: 18/084,079

(22) Filed: Dec. 19, 2022

(65) Prior Publication Data
US 2023/0269890 A1    Aug. 24, 2023

(30) Foreign Application Priority Data
Feb. 18, 2022   (KR) .................. 10-2022-0021627

(51) Int. Cl.
  *H05K 5/00*     (2025.01)
  *H05K 5/02*     (2006.01)
(52) U.S. Cl.
  CPC ................. *H05K 5/0217* (2013.01)
(58) Field of Classification Search
  CPC .................................... H05K 5/0217
  See application file for complete search history.

(56) References Cited

U.S. PATENT DOCUMENTS

| | | | |
|---|---|---|---|
| 9,019,696 | B2 | 4/2015 | Hamers et al. |
| 9,940,892 | B2 | 4/2018 | Pang |
| 10,257,945 | B2 | 4/2019 | Kim et al. |
| 10,362,690 | B2 | 7/2019 | Han |

(Continued)

FOREIGN PATENT DOCUMENTS

| | | | |
|---|---|---|---|
| KR | 101512873 B1 | 4/2015 | |
| KR | 1020170095636 A | 8/2017 | |

(Continued)

OTHER PUBLICATIONS

Li et al., "Analytical and numerical studies on impact force profile of RC beam under drop weight impact", International Journal of Impact Engineering, 147, 2021, 103743.

*Primary Examiner* — Pete T Lee
(74) *Attorney, Agent, or Firm* — CANTOR COLBURN LLP

(57) ABSTRACT

A display device includes a display module rollable in a rolling direction, and a support member facing the display module and rollable together with the display module. The support member includes a plurality of support bars arranged along the rolling direction, and a support layer which is between the display module and the plurality of support bars. Each of the plurality of support bars includes first and second portions at opposing ends of the support bar, along a direction crossing the rolling direction, and a third support portion between the first and second support portions, connecting the first support portion to the second support portion, and corresponding to the display module, where a thickness of each of the first support portion and the second support portion is greater than a thickness of the third support portion.

20 Claims, 13 Drawing Sheets

(56) References Cited

U.S. PATENT DOCUMENTS

| | | | |
|---|---|---|---|
| 10,783,809 B2 | 9/2020 | Kim | |
| 10,798,831 B2 * | 10/2020 | Shin | H05K 5/0217 |
| 12,001,247 B2 * | 6/2024 | Hsu | G06F 1/1652 |
| 2015/0325804 A1 * | 11/2015 | Lindblad | H10K 59/40 |
| | | | 313/511 |
| 2017/0359910 A1 * | 12/2017 | Seo | H05K 5/0217 |
| 2019/0069421 A1 * | 2/2019 | Lee | H05K 5/0017 |

FOREIGN PATENT DOCUMENTS

| | | |
|---|---|---|
| KR | 1020200014112 A | 2/2020 |
| KR | 1020200041846 A | 4/2020 |

* cited by examiner

SUPPORT STRUCTURE AND DISPLAY DEVICE HAVING THE SAME

This application claims priority to Korean Patent Application No. 10-2022-0021627, filed on Feb. 18, 2022, and all the benefits accruing therefrom under 35 U.S.C. § 119, the entire contents of which are hereby incorporated by reference.

BACKGROUND

(1) Field

The present disclosure herein relates to a display device including a support member. More particularly, the present disclosure herein relates to a display device including a support member disposed below a display module.

(2) Description of the Related Art

Electronic equipment for providing an image to a user such as smartphones, digital cameras, laptop computers, navigation systems, and smart televisions includes a display device for displaying an image. The display device generates an image to provide the image to outside the display device (e.g., to the user) through a display screen.

Various types of display devices have been developed with the development of technology of display devices. For example, various flexible display devices that are deformed into a curved shape, folded, or rolled are being developed. The flexible display device may be easily carried and improve a convenience of using the flexible display device.

SUMMARY

A rollable display panel used in a rollable display device has an advantage in that a shape thereof is variously deformable. However, when a flexible laminated structure is applied to implement the rollable display device, such laminated structure is vulnerable to external impacts. When a robust laminated structure is applied, implementing rollability of the rollable display device may be difficult. Therefore, an improved structure of a display device having impact resistance and also rollable characteristics is being developed.

The present disclosure provides an impact-resistant and rollable display device including a support module including support bars, in which concave portions are defined, respectively.

An embodiment of the invention provides a display device including a display module rollable (e.g., to be rolled) in a second direction crossing a first direction with respect to a rolling axis that extends in the first direction, and a support member d on a lower portion of the display module. The support member includes a plurality of support bars, and a support layer configured to cover the support bars, where each of the support bars includes a first support, a second support facing the first support, and a third support between the first support and the second support and adjacent to the display module, and each of the first support and the second support has a thickness less than that of the third support.

In an embodiment, each of the support bars may include a metal or a carbon fiber.

In an embodiment, each of the first support and the second support may have a thickness of about 200 micrometers (μm) or more to about 1,000 μm or less.

In an embodiment, a length of the third support in the first direction may be greater than that of each of the first support and the second support in the first direction.

In an embodiment, each of the support bars may include a first sub support and a second sub support, which are spaced apart from each other in the second direction between the first support and the second support.

In an embodiment, each of the support bars may include a top surface and a bottom surface facing the top surface, a concave portion recessed in a direction of the top surface may be defined in the bottom surface, and the concave portion may be defined to be surrounded by the first to third supports, the first sub support, and the second sub support.

In an embodiment, the support layer may include an elastic polymer.

In an embodiment, the support member may include a first support bar, second support bars arranged at one side of the first support bar in the second direction, and third support bars arranged at the other side of the first support bar in the second direction, where each of the second support bars and the third support bars in the second direction may gradually increase in a direction away from the first support bar.

In an embodiment, the support member may further include a coating layer configured to cover the support bars, and the coating layer may have a modulus greater than that of the support layer and less than that of each of the support bars.

In an embodiment, each of the support bars may have a modulus greater than that of the support layer.

In an embodiment, each of the support bars may have one shape of a rhombus shape, an inverted trapezoid shape, or an inverted triangular shape in a cross-section viewed in the first direction.

In an embodiment of the invention, a display device, which is rolled in a second direction perpendicular to a first direction with respect to a rolling axis that extends in the first direction, includes a display module, and a support member on a lower portion of the display module, the support member including a plurality of support bars and a support layer configured to cover the support bars. Each of the support bars includes atop surface adjacent to the display module, and a bottom surface facing the top surface, where, in a cross-section viewed in the second direction, the bottom surface includes a first portion, in which a concave portion recessed in a direction of the display module is defined, and second portions spaced apart from each other in the first direction with the first portion therebetween.

In an embodiment, a portion of each of the support bars, which corresponds to the second portion, may have a thickness of about 200 μm or more to about 1,000 μm or less.

In an embodiment, each of the support bars may include a metal or a carbon fiber.

In an embodiment, the support layer may include a polymer.

In an embodiment, each of the support bars may further include a first sub support and a second sub support, which are spaced apart from each other in the second direction, on the first portion.

In an embodiment, the support member may include a first support bar, second support bars arranged at one side of the first support bar in the second direction, and third support bars arranged at the other side of the first support bar in the second direction, wherein each of the second support bars and the third support bars in the second direction may gradually increase in a direction away from the first support bar.

In an embodiment, the support member may further include a coating layer configured to cover each of the support bars, and the coating layer may have a modulus greater than that of the support layer and less than that of each of the support bars.

In an embodiment, each of the support bars may have one shape of a rhombus shape, an inverted trapezoid shape, or an inverted triangular shape in a cross-section viewed in the first direction.

In an embodiment, each of the support bars may have a modulus greater than that of the support layer.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
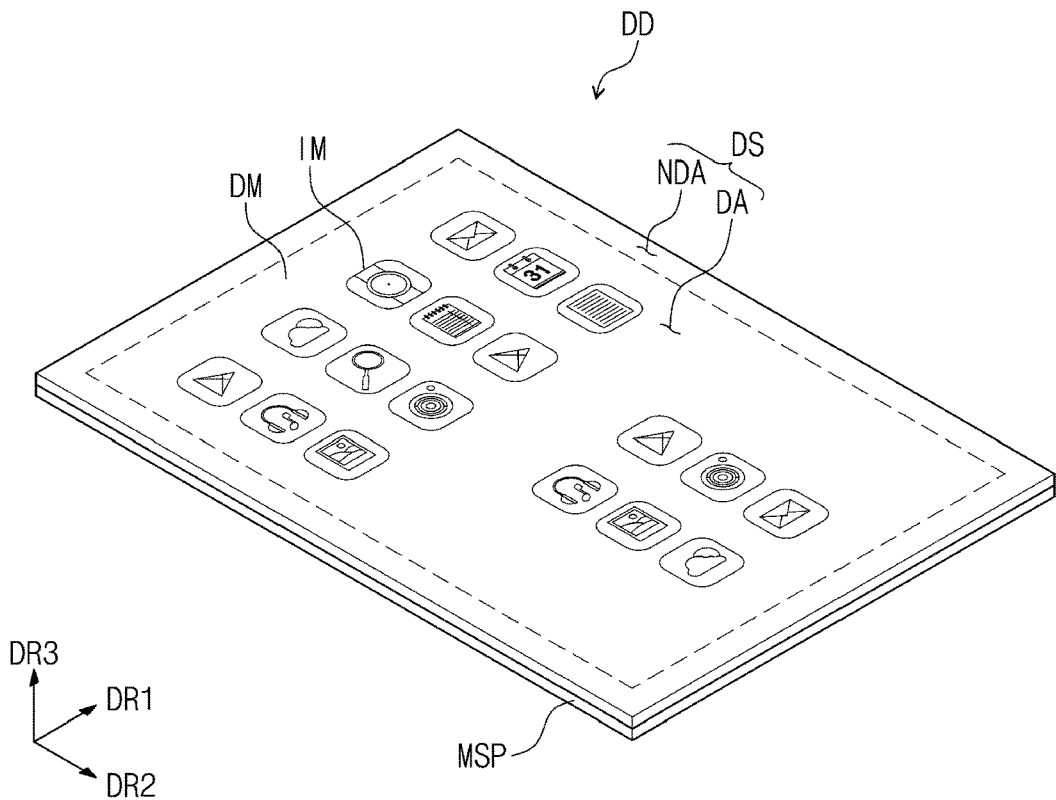
FIG. 1A is a perspective view of a display device according to an embodiment.

Since the invention may have diverse modified embodiments, specific embodiments are illustrated in the drawings and are described in the detailed description of the invention. However, this does not limit the invention within specific embodiments and it should be understood that the invention covers all the modifications, equivalents, and replacements within the idea and technical scope of the invention.

In this specification, it will also be understood that when one component (or region, layer, portion) is referred to as being related to another element such as being 'on', 'connected to', or 'coupled to' another component, it can be directly disposed/connected/coupled on/to the one component, or an intervening third component may also be present. In contrast, when one component (or region, layer, portion) is referred to as being related to another element such as being 'directly on', 'directly connected to', or 'directly coupled to' another component, no intervening third component is present. Elements which are related as being 'directly on' each other, may form an interface therebetween.

Like reference numerals refer to like elements throughout. As used herein, a reference number may indicate a singular element or a plurality of the element. For example, a reference number labeling a singular form of an element within the drawing figures may be used to reference a plurality of the singular element within the text of specification. Also, in the figures, the thickness, ratio, and dimensions of components are exaggerated for clarity of illustration.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated components.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, ""under", "below", "above', "upper", and the like are used for explaining relation association of the elements illustrated in the drawings. The terms may be a relative concept and described based on directions expressed in the drawings.

The meaning of 'include' or 'comprise' specifies a property, a fixed number, a process, an operation, an element, a component or a combination thereof, but does not exclude other properties, fixed numbers, processes, operations, elements, components or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by a person of ordinary skill in the art to which the invention belongs. In addition, terms such as terms defined in commonly used dictionaries should be interpreted as having a meaning consistent with the meaning in the context of the related technology, and unless explicitly defined here, they are interpreted as too ideal or too formal sense.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device DD according to an embodiment will be described with reference to the accompanying drawings.

Figure 1B:
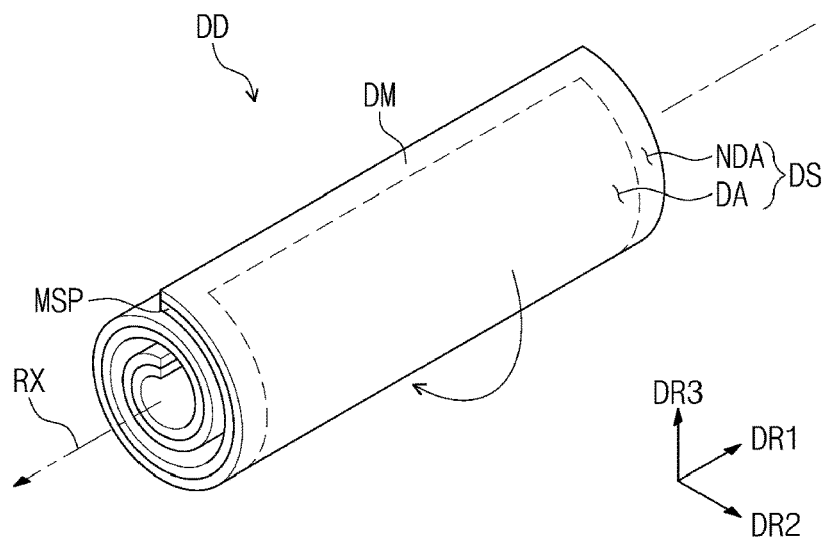
FIG. 1B is a perspective view illustrating a folded state of the display device illustrated in FIG. 1A.

FIG. 1 is a perspective view of a display device DD according to an embodiment. FIG. 1B is a perspective view illustrating a folded state of the display device DD illustrated in FIG. 1A (e.g., the display device DD which is folded).

Referring to FIGS. 1A and 1B, a display device DD may be an electronic device that is activated according to an electrical signal to generate and/or display an image IM. For example, the display device DD may include large-sized devices such as televisions, external billboards and the like, and small and medium-sized devices such as display monitors, mobile phones, tablet computers, navigation systems, game consoles, and the like. Embodiments of the display device DD are not limited thereto as long as the embodiments do not deviate from the concept of the present disclosure.

The display device DD according to an embodiment may be flexible. The "flexible" means a bendable or deformable property and may include a structure that is completely foldable to a size of a few nanometers. For example, the flexible display device DD may include a rollable display device that is rolled around a virtual axis. FIG. 1A illustrates the display device DD which is unfolded (e.g., in an unfolded state), and FIG. 1B illustrates the display device DD which is rolled (e.g., in a rolled state).

Referring to FIG. 1A, the display device DD that is in the unfolded state may be disposed in a plane (e.g. flat) have a rectangular shape that has short sides extending in (or along) a first direction DR1 and long sides extending in (or along) a second direction DR2 crossing the first direction DR1 on a plane. The first direction DR1 and the second direction DR2 may be perpendicular to each other, without being limited thereto. However, an embodiment of the invention is limited thereto, and the display device DD may have various shapes such as a circular shape or a polygonal shape in the unfolded state.

The display device DD may include a display module DM and a support member MSP. The display module DM may generate an image IM in response to an electrical signal and may provide the image IM to outside the display device DD (such as to a user) through a display surface DS. The display module DM that is in the unfolded state may display the image IM in a third direction DR3 and on the display surface DS, which is parallel to a plane defined by the first and second directions DR1 and DR2 which cross each other. The display surface DS on which the image IM is displayed may correspond to a front surface of the electronic device DD.

The image IM provided from the display module DM may include a still image as well as a dynamic image. FIG. TA illustrates a plurality of icons as an example of the image IM.

The front surface (or top surface) and a rear surface (or bottom surface) of each of members constituting the display device DD may be opposed to each other in the third direction DR3, and a normal direction of each of the front and rear surfaces may be substantially parallel to the third direction DR3. A spaced distance between the front surface and the rear surface defined along the third direction DR3 may correspond to a thickness of the member (or unit), e.g., a thickness direction. In this specification, the term "on the plane" may be defined as a state when viewed in the third direction DR3. In this specification, "on the cross-section" may be defined as a state when viewed from the first direction DR1 and/or the second direction DR2. The directions indicated as the first to third directions DR1, DR2, and DR3 may be a relative concept and thus changed into different directions.

The display surface DS of the display module DM may include a display area DA and a peripheral area NDA. The display area DA may be an area (e.g., a planar area) at which the image IM is displayed, and the peripheral area NDA may be an area (e.g., a planar area) on which the image IM is not displayed (e.g., a non-display area). The peripheral area NDA may be provided as an area having a light transmittance less than that of the display area DA and having a predetermined color.

The peripheral area NDA may be adjacent to the display area DA. For example, the peripheral area NDA may surround the display area DA and define an edge of the display module DM. However, an embodiment of the invention is not limited thereto, and the peripheral area NDA may be disposed adjacent to only one side of the display area DA or may be omitted. Alternatively, the peripheral area NDA may be disposed on a side surface of the display device DD instead of a front surface thereof.

The support member MSP may be disposed under the display module DM to support the display module DM. The support member MSP may be disposed on the rear surface of the display module DM and facing the display module DM. For example, the support member MSP may be attached to the rear surface of the display module DM through a separate adhesive layer.

The support member MSP may provide a flat surface to the display module DM to prevent surface quality of the display module DM from being deteriorated. The support member MSP may have predetermined impact resistance and may prevent the display module DM from being damaged by an external impact. The support member MSP may be bendable to be bent to a predetermined curvature and may support the display module DM to prevent the display module DM from being deformed. The support member MSP facing the display module DM may be rollable together with the display module DM. A configuration of the support member MSP will be described later in detail.

Referring to FIG. 1B, the display device DD may be rolled around a virtual rolling axis RX (hereinafter referred to as a rolling axis RX) extending in one direction. For example, the display device DD may be rolled around the rolling axis RX extending in the first direction DR1. Although the rolling axis RX extending in the first direction DR1 parallel to the short sides of the display device DD is illustrated in FIG. 1B as an example, an embodiment of the invention is not limited thereto, and the display device DD may be rolled around the rolling axis parallel to the long sides of the display device DD.

The display module DM may be rolled so that the display surface DS faces the outside. The support member MSP may be disposed under the display module DM to support the display module DM and may be rolled together with the display module DM. As the display device DD is rolled, portability may be facilitated. Thus, the large-area display device may be rolled and accommodated in an accommodation member (not shown).

Figure 2A:
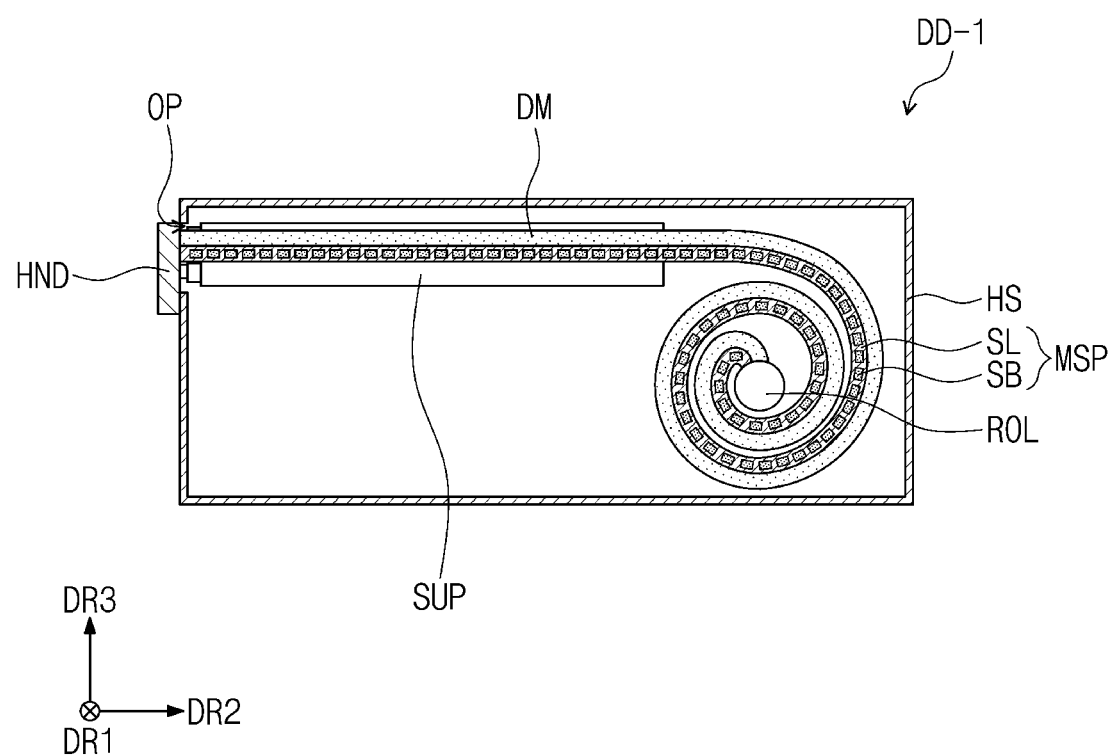
FIG. 2A is a cross-sectional view of the display device according to an embodiment.
Figure 2B:
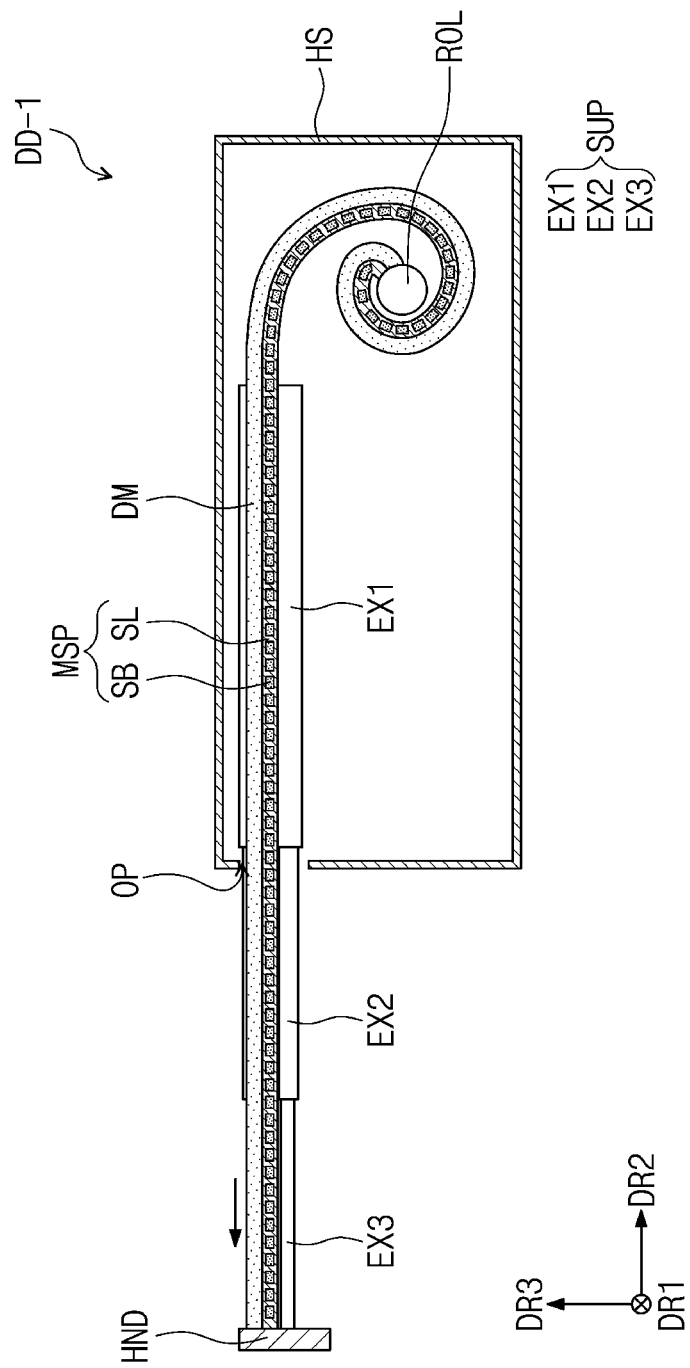
FIG. 2B is a cross-sectional view of the display device according to an embodiment.

FIGS. 2A and 2B are cross-sectional views of the display device DD according to an embodiment. FIG. 2A illustrates a display device DD-1 that is in a state in which the display module DM is rolled and accommodated in a housing HS, and FIG. 2B illustrates a display device DD-1 that is in a state in which a portion of the display module DM is unfolded or unrolled toward the outside of the housing HS.

Referring to FIGS. 2A and 2B, the display device DD-1 according to an embodiment may include a display module DM, a support member MSP, a housing HS, a roller ROL, a support SUP, and a handle HND. The display module DM, the roller ROL, the support member MSP, and the support SUP may be accommodated in the housing HS. The above-described description may be equally applied to descriptions of the display module DM and the support member MSP.

The housing HS may include a bottom surface and a top surface, which are respectively parallel to each of the first and second directions DR1 and DR2, and side surfaces connecting the bottom surface to the top surface to define an accommodating space therein. Although the housing HS having a rectangular shape in cross-section is illustrated in FIG. 2A, this is merely an example, and if the display module DM is capable of being accommodated in the housing HS, the shape of the housing HS is not limited to any one embodiment.

An opening OP may be defined in at least one of the side surfaces of the housing HS. The opening OP may expose the accommodating space of the housing HS to outside the housing HS. FIG. 2A illustrates an example of the opening OP defined in each of the side surfaces of the housing HS, which are parallel to the first direction DR1 and the third direction DR3, respectively. The opening OP may be defined adjacent to an upper portion of the housing HS, but the position of the opening OP is not limited thereto.

The roller ROL may be disposed adjacent to one surface of the housing HS, in which the opening OP is defined, and the other surface of the housing HS, which is spaced apart from the one surface in the second direction DR2 in the housing HS. The roller ROL may have a cylindrical shape extending in the first direction DR1, and when viewed in the first direction DR1, the roller ROL may have a circular shape. The extending direction of the roller ROL may correspond to an extending direction of a rolling axis. The roller ROL may be rotatable to rotate in a clockwise and counterclockwise direction. Although not shown separately, the display device DD-1 may further include a driving part for rotating the roller ROL.

The handle HND may be disposed outside the housing HS and adjacent to the opening OP. In an embodiment, the handle HND may cover the opening OP. The handle HND may be movable to move in parallel in the second direction DR2. As illustrated in FIG. 2B, when the handle HND moves away from the housing HS along the second direction DR2, the opening OP (and consequently the accommodating space) may be exposed to the outside. The handle HND may be manipulated from outside the housing HS, such as by a user.

The display module DM and the support member MSP may be windable to be wound around the roller ROL. One end of each of the display module DM and the support member MSP (e.g., a first end) may be connected to the roller ROL. In the cross-section illustrated in FIG. 2A, as the roller ROL rotates in the clockwise direction, the display module DM and the support member MSP may be rolled to surround the roller ROL.

The other end of each of the display module DM and the support member MSP (e.g., a second end opposite to the first end) may be adjacent to the opening OP and may be connected to the handle HND. In the cross-section illustrated in FIG. 2B, when the handle HND moves away from the housing HS along the second direction DR2, the roller ROL may rotate in the counterclockwise direction, and the display module DM and the support member MSP may be withdrawn from inside the housing HS to the outside of the housing HS, through the opening OP. That is, the display module DM together with the support member MSP are withdrawable out of the housing HS and retractable into the housing HS, via the opening OP.

The support SUP may be disposed adjacent to the opening OP, in the housing HS. The support SUP may extend in the first direction DR1. The support SUP may be provided in plurality and thus may be disposed on both sides of the display module DM and the support member MSP, which extend in the second direction DR2.

The support SUP may support the display module DM and the support member MSP, which are disposed in the housing HS. In an embodiment, a guide groove may be defined in the support SUP, and the support member MSP may be disposed in the guide groove and supported by the support SUP. However, this embodiment is not limited thereto.

One end of the support SUP may be connected to the handle HND. The support SUP may be expandable to be expanded to the outside of the housing HS through the opening OP, according to the movement of the handle HND. The support SUP may extend to the outside of the housing HS to support a portion of the display module DM which is disposed outside of the housing HS.

Referring to FIG. 2B, the support SUP may include a first extension part EX1, a second extension part EX2, and a third extension part EX3, so as to be expanded to the outside of the housing HS. The second extension part EX2 may be disposed between the first extension part EX1 and the third extension part EX3 in the second direction DR2.

To realize a structure that is capable of being expanded in one direction, the second extension part EX2 may be insertable into and withdrawable from the first extension part EX1, and the third extension part EX3 may be insertable into and withdrawable from the second extension part EX2, such that the various extension parts are nested in a retracted state of the support SUP. The first extension part EX1 may be disposed in the housing HS, and the second and third extension parts EX2 and EX3 may be moveable to move to the outside of the housing HS. The third extension part EX3 may be connected to the handle HND. The first extension part EX1 may remain in the housing HS, even when the support SUP is extended to dispose the second and third extension parts EX2 and EX3 outside of the housing HS, without being limited thereto.

A guide groove may be defined in each of the first, second, and third extension parts EX1, EX2, and EX3. The guide grooves defined in the first, second, and third extension parts EX1, EX2, and EX3 may be defined as continuous spaces overlapping (or aligned with) each other in the first direction DR1. The support member MSP may be disposed in each of the guide grooves, which are respectively defined in the first, second, and third extensions EX1, EX2, and EX3, and may be supported by the first, second, and third extension parts EX1, EX2, and EX3.

When the handle HND moves from a position away from the opening OP (refer to FIG. 2B), to again to be adjacent to the housing HS in the second direction DR2, a length of the expanded support SUP along the second direction DR2 may be reduced in the second direction DR2, as illustrated in FIG. 2A. As the handle HND moves, portions of the support SUP may be disposed inside the housing HS, and the display module DM and the support member MSP may be inserted into the housing HS together with the portions of the support SUP. While the display module DM is withdrawn from the housing HS (e.g., extended) or inserted into the housing HS (e.g., retracted), a portion of each of the display module DM and the support member MSP supported by the support SUP is in a flat state.

The support member MSP may include a support layer SL and a plurality of support bars SB (hereinafter, referred to as support bars SB). The support bars SB may be disposed inside the support layer SL. Each of the support bars SB may extend in the extension direction of the rolling axis. The support bars SB may be arranged in a direction crossing the extension direction. For example, as illustrated in FIGS. 2A and 2B, the support bars SB may extend in the first direction DR1 and may be arranged inside the support layer SL in the second direction DR2.

The support layer SL may cover the support bars SB. In an embodiment, the support layer SL may be directly disposed on the support bars SB. The integral support layer SL may cover top and bottom surfaces of each of the support bars SB. The integral support layer SL may be filled between the support bars SB spaced apart from each other by a space, in the second direction DR2. Thus, the support layer SL may connect the support bars SB spaced apart from each other, to each other, so that the support bars SB move together with each other and with the support layer SL.

A modulus of each of the support bars SB may be greater than that of the support layer SL. That is, the modulus of one support bar SB may be greater than that of the support layer SL. The support bars SB may include a material having rigidity greater than that of the support layer SL. The support bars SB may support the display module DM and may improve impact resistance of the support member MSP.

The support layer SL may include a material having flexibility greater than that of the support bars SB. The support layer SL may connect the spaced apart support bars SB to each other and allow the support member MSP to be easily bent to a predetermined curvature. The support layer SL may cover the support bars SB and may provide a flat top surface to the display module DM. Thus, the support layer SL may improve surface quality of the display module DM.

Figure 3A:
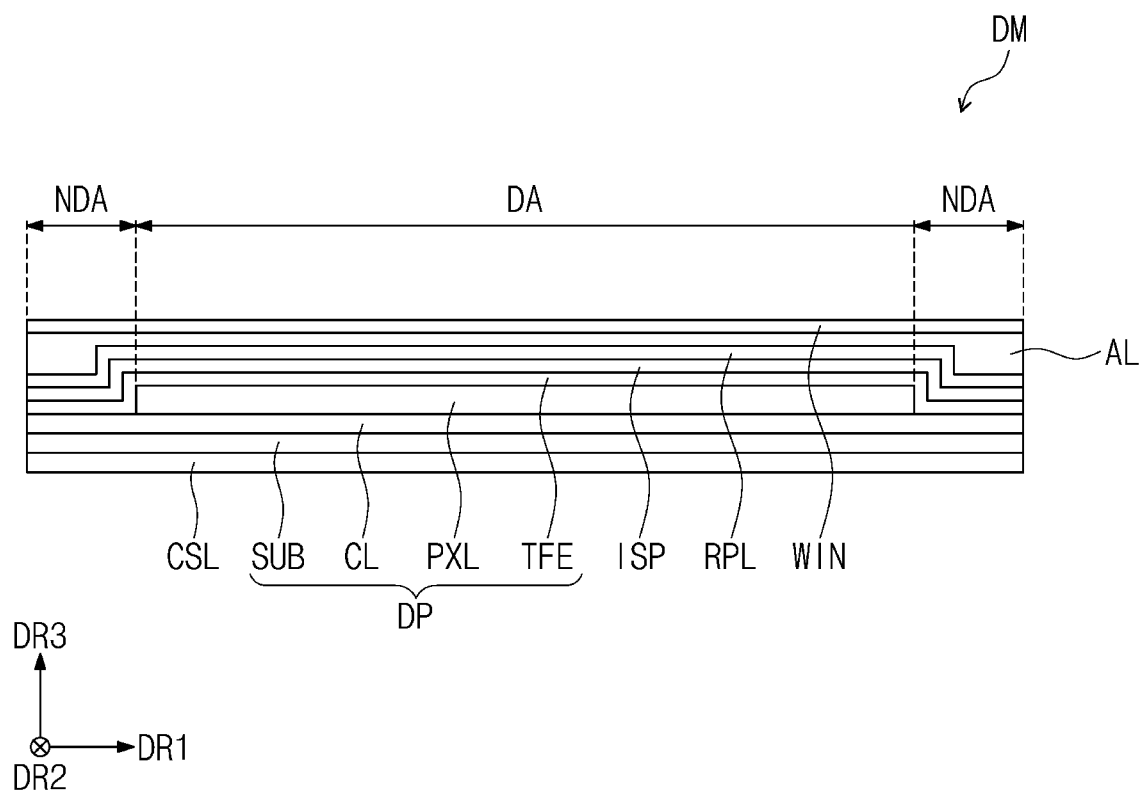
FIGS. 3A and 3B are a cross-sectional and a plan view of a display module, respectively, according to an embodiment.
Figure 3B:
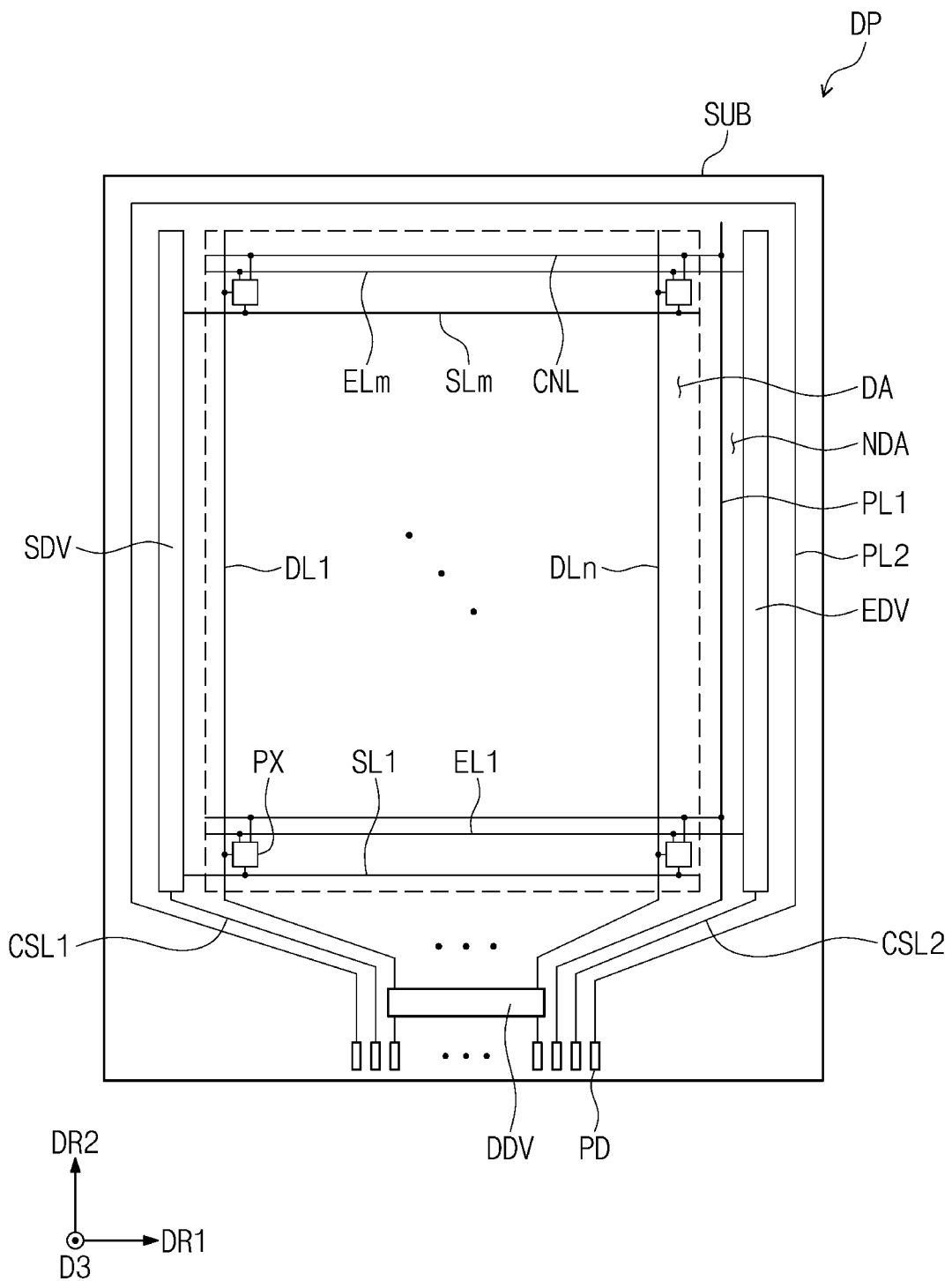

FIGS. 3A and 3B (otherwise referred to as FIG. 3) are a cross-sectional view and a plan view of the display module DM, respectively, according to an embodiment of the invention. Referring to FIG. 3, the display module DM may include a display panel DP, an input sensing layer ISP, an anti-reflection layer RPL, a window WIN, an adhesive layer AL, and a lower member CSL.

The display panel DP may be a flexible display panel. The display panel DP according to an embodiment of the invention may be an emission type display panel, but is not limited thereto. For example, the display panel DP may be an organic light emitting display panel or an inorganic light emitting display panel. An emission layer of the organic light emitting display panel may include an organic light emitting material. An emission layer of the inorganic light emitting display panel may include an inorganic light emitting material such as quantum dots or quantum rods.

The display panel DP may include a base substrate SUB, a circuit layer CL, a display element layer PXL, and an encapsulation layer TFE. The base substrate SUB, the circuit layer CL, the display element layer PXL, and the encapsulation layer TFE may be sequentially laminated in the third direction DR3.

The base substrate SUB may include a display area DA and a peripheral area NDA which respectively correspond to the display area DA and the peripheral area NDA of the above-described display module DM. The base substrate SUB may provide a base surface on which the circuit layer CL is disposed.

The base substrate SUB may include a flexible plastic substrate. For example, the base substrate SUB may include at least one synthetic resin layer. The synthetic resin layer of the base substrate SUB may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin. However, this is merely an example, and the material of the base substrate SUB is not limited to the examples listed above.

The circuit layer CL may be disposed on the base substrate SUB. The circuit layer CL may include at least one insulating layer, driving elements, signal lines, and signal pads. The circuit layer CL may include a conductive pattern and a semiconductor pattern forming the driving elements, the signal lines, and the signal pads. After forming an insulating layer, a semiconductor layer, and a conductive layer on the base substrate SUB through methods such as coating, deposition, etc., the insulating layer, the semiconductor layer, and the conductive layer may be selectively patterned through photolithography to form the driving elements, the signal lines, and the signal pads, which are provided in the circuit layer CL.

The display element layer PXL may be disposed on the circuit layer CL. The display element layer PXL may include light emitting elements disposed to overlap the display area DA. The light emitting elements of the display element layer PXL may be electrically connected to the driving elements of the circuit layer CL to provide light through the display area DA according to a signal of the driving element.

The encapsulation layer TFE may be disposed on the display element layer PXL to encapsulate the light emitting elements. The encapsulation layer TFE may include a plurality of thin films. The thin films of the encapsulation layer TFE may be disposed to improve optical efficiency of the light emitting element or protect the light emitting element. In an embodiment, the encapsulation layer TFE may include at least one inorganic layer and organic layer. The inorganic layer of the encapsulation layer TFE may protect the light emitting element from moisture/oxygen. The organic layer of the encapsulation layer TFE may protect the light emitting element from foreign substances such as dust particles.

The input sensing layer ISP may be disposed on the display panel DP. The input sensing layer IS may be directly disposed on the display panel DP without a separate adhesive member. That is, after the display panel DP is formed, the input sensing layer IS may be formed on the base surface provided by the display panel DP through a continuous process. For example, the sensing layer ISP may be directly disposed on the encapsulation layer TFE. However, this embodiment is not limited thereto, and the input sensing layer IS may be manufactured in the form of a panel trough a separate manufacturing process different from that of the display panel DP and then be attached to the display panel DP by an adhesive member.

The input sensing layer ISP may sense an external input applied from the outside of the display device DD (see FIG. TA) and acquire coordinate information of the external input. The input sensing layer IS may be driven in various methods such as a capacitive method, a resistive method, an infrared method, or a pressure method, but is not limited thereto.

The anti-reflection layer RPL may be disposed on the input sensing layer ISP. The anti-reflection layer RPL may be directly disposed on the input sensing layer ISP. However, an embodiment of the invention is not limited thereto, and the anti-reflection layer RPL may be coupled to the input sensing layer ISP through a separate adhesive member.

The anti-reflection layer RPL may reduce reflectance of external light incident from an upper side of the display device DD (see FIG. TA). The anti-reflection layer RPL may include various embodiments in which the reflectance of the external light is reduced.

In an embodiment, the anti-reflection layer RPL may include a phase retarder and/or a polarizer. The phase retarder may include a λ/2 phase retarder and/or a λ/4 phase retarder. The polarizer may include a film type or a liquid crystal coating type. The film type polarizer may include a stretchable synthetic resin film, and the liquid crystal coating type polarizer may include liquid crystals arranged in a predetermined arrangement. An embodiment of the invention is not limited thereto, and the phase retarder and the polarizer may be implemented in the form of one polarizing film.

In an embodiment, the anti-reflection layer RPL may include color filters. The color filters may be disposed to correspond to an arrangement of pixels PX provided in the display panel DP and an emission color. The color filters may receive external light to filter the external light with the same color as the color emitted by the pixels PX. The anti-reflection layer RPL may further include a black matrix disposed adjacent to the color filters.

In an embodiment, the anti-reflection layer RPL may include a destructive interference structure. For example, the destructive interference structure may include a first reflection layer and a second reflection layer, which are disposed on different layers. First reflection light reflected from the first reflection layer and second reflection light reflected from the second reflection layer may destructively interfere with each other, and thus, the anti-reflection layer RPL may reduce the reflectance of the external light.

The adhesive layer AL may be disposed on the anti-reflection layer RPL. The adhesive layer AL may be disposed between the anti-reflection layer RPL and the window WIN to couple the anti-reflection layer RPL to the window WIN. The adhesive layer AL may include a transparent adhesive such as an optically clear adhesive film (OCA), an optically clear adhesive resin (OCR), or a pressure sensitive adhesive film (PSA). However, this is only an example, and the type of adhesives provided in the adhesive layer AL is not limited thereto.

The window WIN may be disposed on the anti-reflection layer RPL. The window WIN may cover the entire outside of the display panel DP, the input sensing layer ISP, and the anti-reflection layer RPL and may protect components of the display module DM from external impacts and scratches.

The window WIN may include an optically transparent insulating material. For example, the window WIN may include glass, sapphire, or a polymer. The window WIN may have a single or multi-layered structure. The window WIN may further include functional layers such as an anti-fingerprint layer, a phase control layer, and a hard coating layer, which are disposed on the optically transparent substrate.

The lower member CSL may be disposed on a rear surface of the display panel DP. The lower member CSL may be coupled to the rear surface of the display panel DP by an adhesive member, but is not limited thereto, and may be directly disposed on the rear surface of the display panel DP. The lower member CSL may include at least one of a protective film layer protecting the display panel DP from the external impact or an impact absorbing layer.

The protective film layer may include a flexible polymer material such as polyethylene terephthalate or polyimide. The impact absorbing layer may include a material such as a sponge, foam, or a urethane resin and may absorb an impact applied to the display panel DP. The shape of the lower member CSL is not limited to any one embodiment as long as the lower member CSL is capable of protecting the display panel DP.

FIG. 3B is a plan view of the display panel according to an embodiment of the invention. In the plan view of FIG. 3B, one component of the display panel DP is schematically illustrated.

Referring to FIG. 3B, the display panel DP may include a base substrate SUB, a plurality of pixels PX, a plurality of signal lines SL1 to SLm, DL1 to DLn, and EL1 to ELm, CSL1, CSL2, PL1, PL2, and CNL, which are electrically connected to the pixels PX, a scan driver SDV, a data driver DDV, and an emission driver EDV.

The base substrate SUB may include the display area DA and the peripheral area NDA as described above. The base substrate SUB may provide a base surface on which electrical elements and lines of the display panel DP are disposed. Although the base substrate SUB having a rectangular shape parallel to each of the first and second directions DR1 and DR2 on the plane is illustrated in FIG. 3B as an example, it is not limited thereto, and the shape of the base substrate SUB may be designed in various shapes according to the structure of the display device DD (see FIG. 1A).

Each of the pixels PX may include a pixel driving circuit including a light emitting element, a plurality of transistors (e.g., a switching transistor, a driving transistor, etc.) connected to the light emitting element, and at least one capacitor. Each of the pixels PX may emit light in response to an electrical signal applied to the pixel PX.

The pixels PX may be disposed on the display area DA. However, this is merely an example, and some of the pixels PX may include a thin film transistor disposed on the peripheral area NDA, but is not limited to any one embodiment.

The scan driver SDV, the data driver DDV, and the emission driver EDV may be disposed on the peripheral area NDA. However, an embodiment of the invention is not limited thereto, and in an embodiment, at least one of the scan driver SDV, the data driver DDV, and the emission driver EDV may overlap the display area DA, and thus, a surface area of the peripheral area NDA may be reduced to reduce a bezel area of the display device DD (see FIG. 1A).

The data driver DDV may be provided in the form of an integrated circuit chip defined as a driving chip and may be mounted on the peripheral area NDA of the display panel DP. However, an embodiment of the invention is not limited thereto, and the data driver DDV may be mounted on a separate flexible circuit board connected to the display panel DP and electrically connected to the display panel DP.

The plurality of signal lines SL1 to SLm, DL1 to DLn, EL1 to ELm, CSL1, CSL2, PL1, PL2, and CNL may include a plurality of scan lines SL1 to SLm, a plurality of data lines DL1 to DLn, a plurality of emission lines EL1 to ELm, first and second control lines CSL1 and CSL2, first and second power lines PL1 and PL2, and connection lines CNL. Here, 'm' and 'n' are natural numbers.

The scan lines SL1 to SLm may extend in the first direction DR1 and be connected to the scan driver SDV. The data lines DL1 to DLn may extend in the second direction DR2 and be connected to the data driver DDV. The emission lines EL1 to ELm may extend in the first direction DR1 and be connected to a gate driver EDV.

The first power line PL1 may extend in the second direction DR2 and be disposed on the peripheral area NDA. The first power line PL1 may be disposed between the display area DA and the emission driver EDV. However, the embodiment of the invention is not limited thereto, and the first power line PL1 may be disposed between the display area DA and the scan driver SDV.

The connection lines CNL may extend in the first direction DR1 and may be arranged in the second direction DR2 so as to be connected to the first power line PL1 and the pixels PX. The connection lines CNL may be disposed on a layer that is different from that of the first power line PL1 so as to be electrically connected. However, an embodiment of the invention is not limited thereto, and the connection lines CNL may be integrally provided on the same layer as the first power line PL1. The first voltage may be applied to the pixels PX through the first power line PL1 and the connection lines CNL, which are connected to each other. As being on a same layer, elements may be formed in a same process and/or include a same material, elements may be in a same layer as each other as respective portions of a same material layer, may be on a same layer by forming an interface with a same underlying or overlying layer, etc., without being limited thereto.

The second power line PL2 may be disposed on the peripheral area NDA. The second power line PL2 may be disposed outside the scan driver SDV and the emission driver EDV. Although not shown separately, the second power line PL2 may extend toward the display area DA and be connected to the pixels PX. A second voltage having a level less than that of the first voltage may be applied to the pixels PX through the second power line PL2. The first voltage and the second voltage may be respectively applied to electrodes of the light emitting element of the pixel PX, and thus, the light emitting element may generate light to emit the light.

The first control line CSL1 may be connected to the scan driver SDV. The second control line CSL2 may be connected to the emission driver EDV.

A pad PD provided in plural including a plurality of pads PD may be disposed adjacent to a lower end of the peripheral area NDA. The pads PD may be disposed closer to a lower end of the display panel DP, than the data driver DDV. The pads PD may be arranged in the first direction DR1. The display device DD (see FIG. 1A) may include a circuit board including a timing controller for controlling operations of the scan driver SDV, the data driver DDV, and the emission driver EDV, and a voltage generator for generating a voltage, and the pads PD may be portions to which the circuit board of the display device DD (see FIG. 1A) is connected.

Each of the pads PD may be connected to the corresponding signal line among the plurality of signal lines. The first and second power lines PL1 and PL2 and the first and second control lines CSL1 and CSL2 may be connected to the pads PD. The data lines DL1 to DLn may be connected to corresponding pads PD through the data driver DDV. For example, the data lines DL1 to DLn may be connected to the data driver DDV, and the data drivers DDV may be connected to the pads PD, which respectively correspond to the data lines DL1 to DLn.

The scan driver SDV may generate scan signals in response to scan control signals. The scan signals may be applied to the pixels PX through the scan lines SL1 to SLm. The data driver DDV may generate data voltages corresponding to image signals in response to data control signals. The data voltages may be provided to the pixels PX through the data lines DL1 to DLn. The emission driver EDV may generate emission signals in response to emission signals. The emission signals may be applied to the pixels PX through the emission lines EL1 to ELm.

The pixels PX may receive the data voltages in response to the scan signals. The pixels PX may emit light having luminance corresponding the data voltages in response to the emission signals to display an image. Emission times of the pixels PX may be controlled by the emission signals, respectively. The display panel DP may output an image through the display area DA by the pixels PX.

Figure 4:
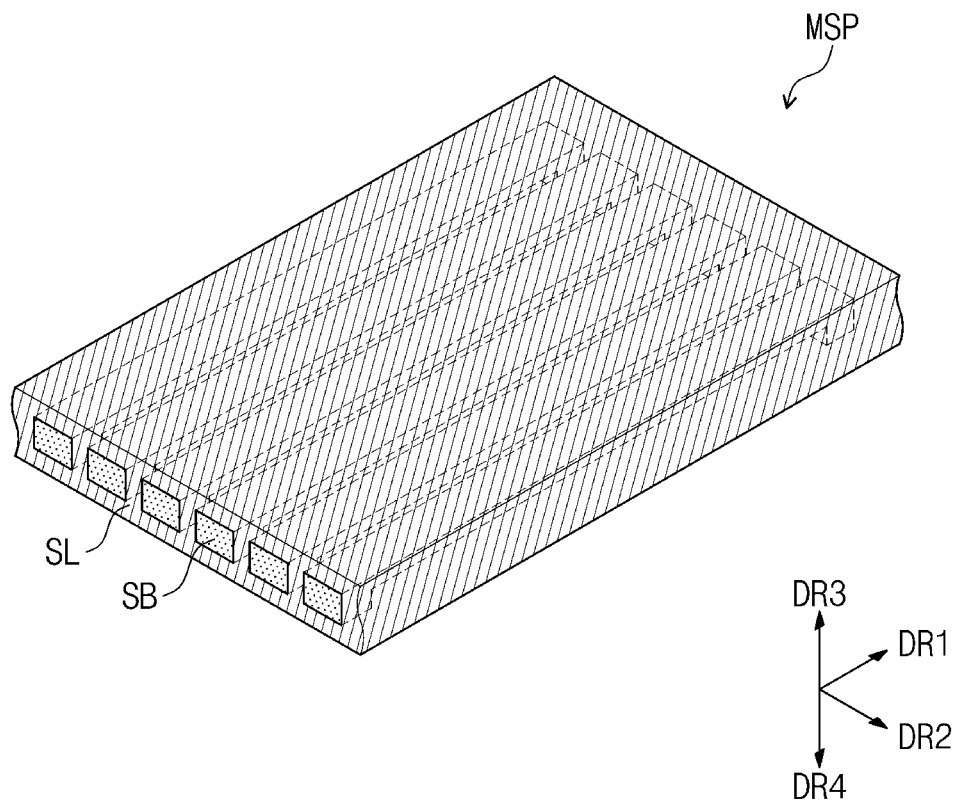
FIG. 4 is a perspective view of a support member according to an embodiment.
Figure 5:
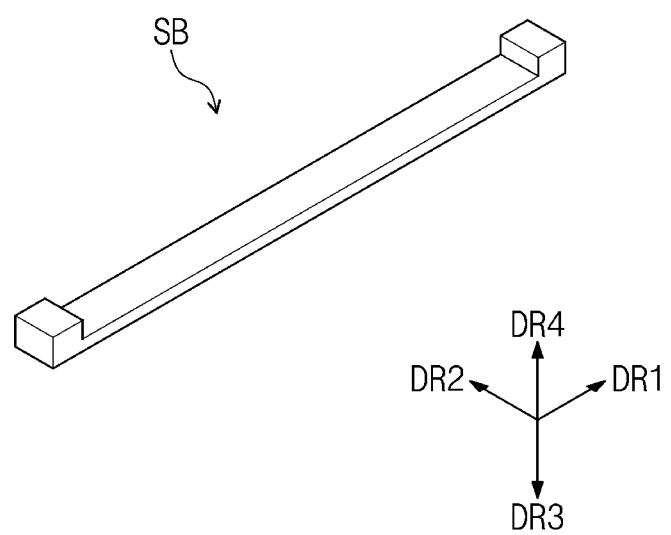
FIG. 5 is a perspective view of a support bar according to an embodiment.
Figure 6:
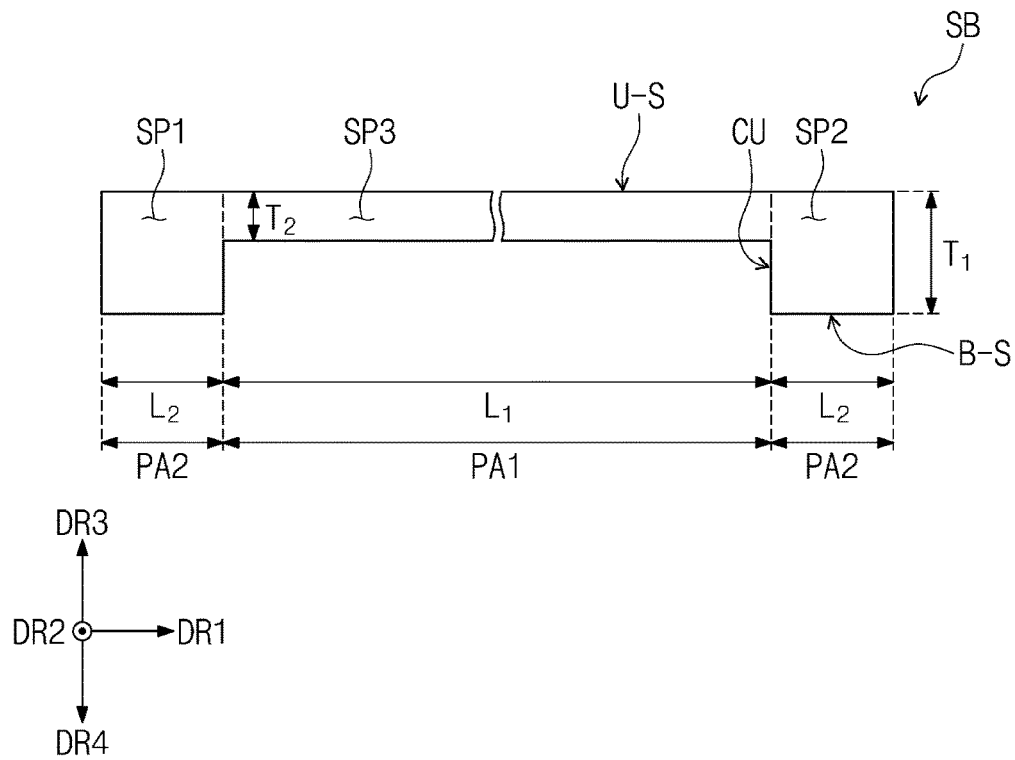
FIG. 6 is a front view of the support bar according to an embodiment.
Figure 7:
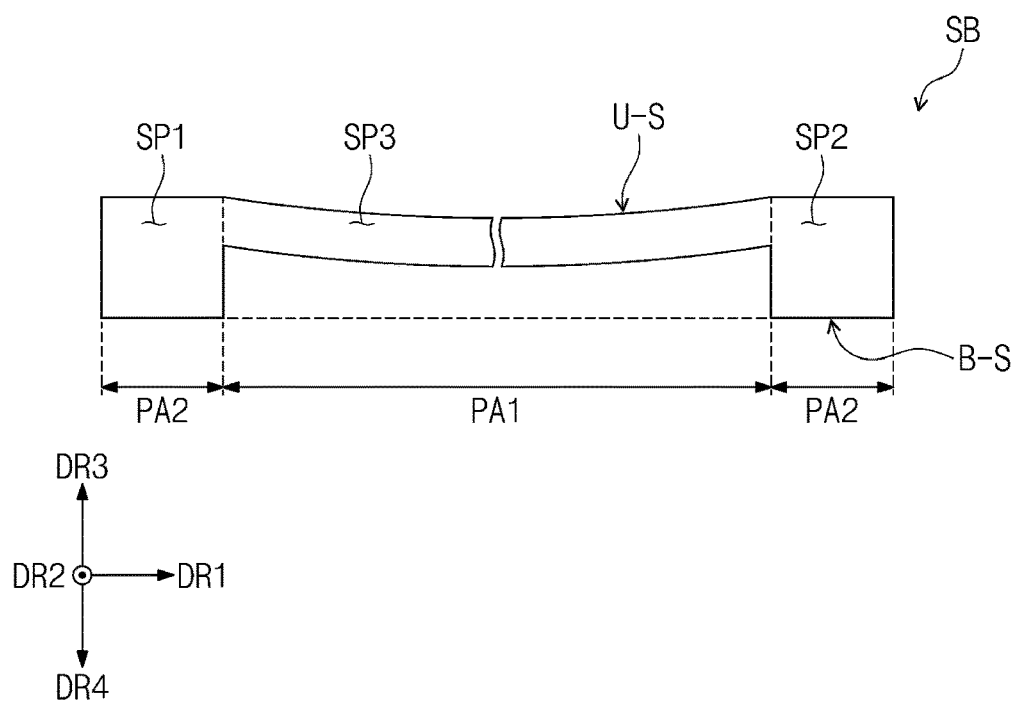
FIG. 7 is a front view of the support bar according to an embodiment.

FIG. 4 is a perspective view of a support member MSP according to an embodiment. FIG. 5 is a perspective view of a support bar SB according to an embodiment. FIG. 6 is a front view of the support bar SB according to an embodiment. FIG. 7 is a front view of the support bar SB according to an embodiment; FIG. 6 is a view illustrating a state before the support bar SB is bent according to an embodiment. FIG. 6 is a view illustrating a state after the support bar SB is bent according to an embodiment.

Referring to FIGS. 4 to 7, a support member MSP may include a support layer SL and support bars SB. The support layer SL may cover the support bars SB. The support layer SL may be integrally provided and may connect the support bars SB spaced apart from each other, to each other. The support bars SB may be connected to each other by the support layer SL, and the connected support bars SB may move together.

A thickness of the support layer SL may be uniform in an area in which the display module DM (see FIG. 1A) is disposed. A maximum thickness of the support layer SL may correspond to a thickness of the support member MSP including both the support layer SL and the support bars SB. The thickness of the support layer SL may be defined between upper and lower surfaces of the support layer SL, at positions corresponding to the support bars SB and locations between the support bars SB along the second direction DR2. Thus, the support member MSP according to an embodiment may have a substantially uniform thickness corresponding to the area on which the display module DM (see FIG. 1A) is disposed.

The support layer SL having the uniform thickness may provide flat upper and bottom surfaces at both the area at which the support bars SB are disposed and the area corresponding to a space between the support bars SB spaced apart from each other along the second direction DR2. Since the display module DM (see FIG. 1A) is disposed on the top surface of the support layer SL having the flat surface, a portion of the display module DM (see FIG. 1A) overlapping the space between the support bars SB may be maintained in the flat state without being deformed. That is, the surface quality of the display module DM may be improved by the support layer SL. An upper surface of the support member MSP may be closest to the display module DM, while a lower surface which is opposite to the upper surface, may be furthest from the display module DM (or closest to the support SUP).

The support layer SL may include a polymer. The support layer SL may include an elastic polymer having predetermined elastic force. For example, the support layer SL may include at least one of thermoplastic polyurethane, silicone, thermoplastic rubbers, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomers, and ethylene-vinyl acetate.

Each of the support bars SB may extend in the first direction DR1 parallel to the rolling axis. The support bars SB may be arranged in the second direction DR2 crossing the extending direction of the support bars SB or along the rolling direction (e.g., the second direction DR2) of the display module DM. The support bars SB may be disposed to have a same distance between each other in the second direction DR2. However, this is merely an example, an embodiment of the invention is not limited thereto, and the distances between the support bars SB along the second direction DR2 may be different from each other.

The support bars SB may all have the same width in the first direction DR1. The support bars SB may all have the same width in the second direction DR2. However, this is merely an example, an embodiment of the invention is not limited thereto, and at least one of the support bars SB may have a width different from that of each of the others in the first direction DR1, or at least one of the support bars SB may have a width different from that of each of the others in the second direction DR2.

Both of opposing ends of the support bars SB facing each other in the first direction DR1 may be exposed to the outside of the support layer SL. Referring to FIG. 4, for example, the support bars SB are exposed to outside the support member MSP at a side surface of the support layer SL. However, an embodiment of the invention is not limited thereto, and both the ends of the support bars SB may be disposed in the support layer SL to be spaced apart from the side surface of the support layer SL along the first direction DR1.

Each of the support bars SB may have predetermined rigidity. For example, each of the support bars SB may include a metal or carbon fiber. The support bars SB may include aluminum, stainless steel, invar, or carbon fiber reinforced plastic (CFRP).

A modulus of each of the support bars SB may be greater than that of the support layer SL. In an embodiment, a modulus of the support layer SL may be about 10 gigapascals (GPa) or more and about 100 megapascals (MPa) or less. Specifically, the support layer SL may have a modulus of about 10 kilopascals (KPa) or more and about 100 KPa or less. In an embodiment, a modulus of the support bars SB may be about 10 GPa or more and about 100 GPa or less. The support bars SB having the relatively large modulus may support the display module DM (see FIG. 1A) and may improve the impact resistance of the support member MSP.

In the cross-section viewed in the second direction DR2, the support bars SB may extend to have a major dimension in the first direction DR1. Each of the support bars SB may include a top surface U-S adjacent to (e.g., closest to) the display module DM (FIG. 2A). Also, each of the support bars SB may include a bottom surface B-S that is opposite to the top surface U-S. The bottom surface B-S may include portions which are extended in different planes from each other.

A concave portion CU recessed toward the top surface U-S may be defined from a plane corresponding to the bottom surface B-S of each of the support bars SB in the cross-section viewed in the second direction DR2. That is, the concave portion CU may be defined by being recessed in the bottom surface B-S and in the third direction DR3. The bottom surface B-S may include a first portion PA1 corresponding to the concave portion CU, and second portions PA2 spaced apart from each other in the first direction DR1 with the first portion PA1 therebetween. The concave portion CU may be defined by the first portion PA1 of the bottom surface B-S together with side portions extending from the first portion PA1 and connected to the second portions PA2. Referring to FIG. 5, the concave portion CU may be open in a direction away from the display module DM, and in opposing directions along the second direction DR2.

The support bars SB may include a first support SP1 (e.g., a first support portion), a second support SP2 (e.g., second support portion), and a third support SP3 (e.g., a third support portion). The second support SP2 may face the first support SP1. The third support SP3 may be disposed between the first support SP1 and the second support SP2 which face each other. The third support SP3 may correspond to the display module DM (FIG. 2A), while the second and third supports SP2 and SP3 may be adjacent to the display module DM, along the first direction DR1. That is, each bar among the plurality of support bars SB may include the first support portion and the second support portion at opposing ends of the each support bar SB, along a direction (e.g., the first direction DR1) crossing the rolling direction (e.g., the second direction DR2), and the third support portion which is between the first support portion and the second support portion, connects the first support portion to the second support portion, and corresponds to the display module DM. A thickness T1 of the first support SP1 and the second support SP2 may be the same.

The thickness T1 of each of the first support SP1 and the second support SP2 may be greater than a thickness T2 of the third support SP3. The thickness T1 of each of the first support SP1 and the second support SP2 may be about 200 micrometers (µm) or more and about 1,000 µm or less. When the thickness T1 of each of the first support SP1 and the second support SP2 is less than about 200 µm, drooping of the support member MSP by a load of the display module DM (FIG. 2A) disposed on the support member MSP (FIG. 2A) may be prevented. When the thickness T1 of each of the first support SP1 and the second support SP2 exceeds about 1,000 µm, flexibility of the support member MSP may be reduced, and thus, there may be a limitation in implementing the rollable characteristics of the support member MSP. However, this is merely an example, and the thickness T1 of each of the first support SP1 and the second support SP2 is not limited thereto and thus may be changed.

A width L1 of the third support SP3 in the first direction DR1 may be greater than a width L2 of each of the first support SP1 and the second support SP2 in the first direction DR1. As the width L1 of the third support SP3 in the first direction DR1 decreases, the drooping of the support member MSP due to the load of the display module DM (FIG. 2A) disposed on the support member MSP may be reduced.

The support bar SB according to an embodiment may have the concave portion CU defined in the bottom surface B-S, and thus, an air gap may be provided between the first support SP1, the second support SP2, and the third support SP3. Therefore, as illustrated in FIG. 7, the third support SP3 of the support bar SB may be bendable to be bent. The structure of the support bars SB may be reversibly changed, that is, restorable to an original position. That is, after being bent in the fourth direction DR4 as illustrated in FIG. 7, the third support SP3 may return to the non-bent state (e.g., original position) as illustrated in FIG. 6. Thus, the support bar SB may have elasticity, and the support member MSP including the plurality of elastic support bars SB may provide the impact resistance to the display device DD (FIG. 1A).

Hereinafter, an electronic device according to an embodiment will be described with reference to FIGS. 8 to 16. The same contents as those described with reference to FIGS. 1 to 7 will not be described again, but differences therebetween will be mainly described.

Figure 8:
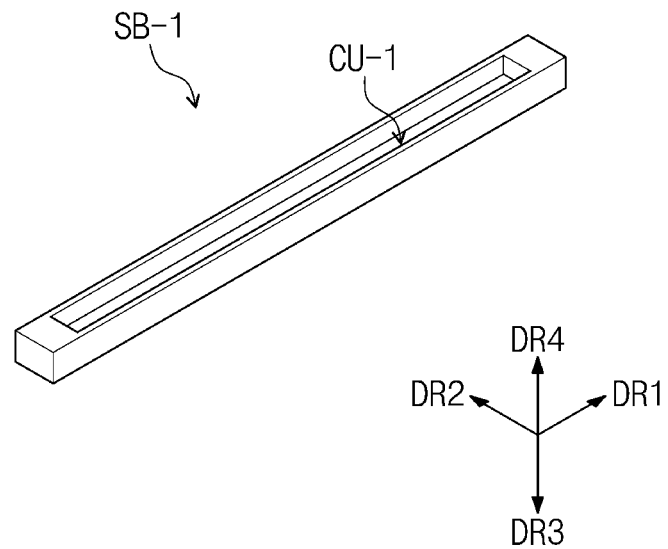
FIG. 8 is a perspective view of the support bar according to an embodiment.
Figure 9:
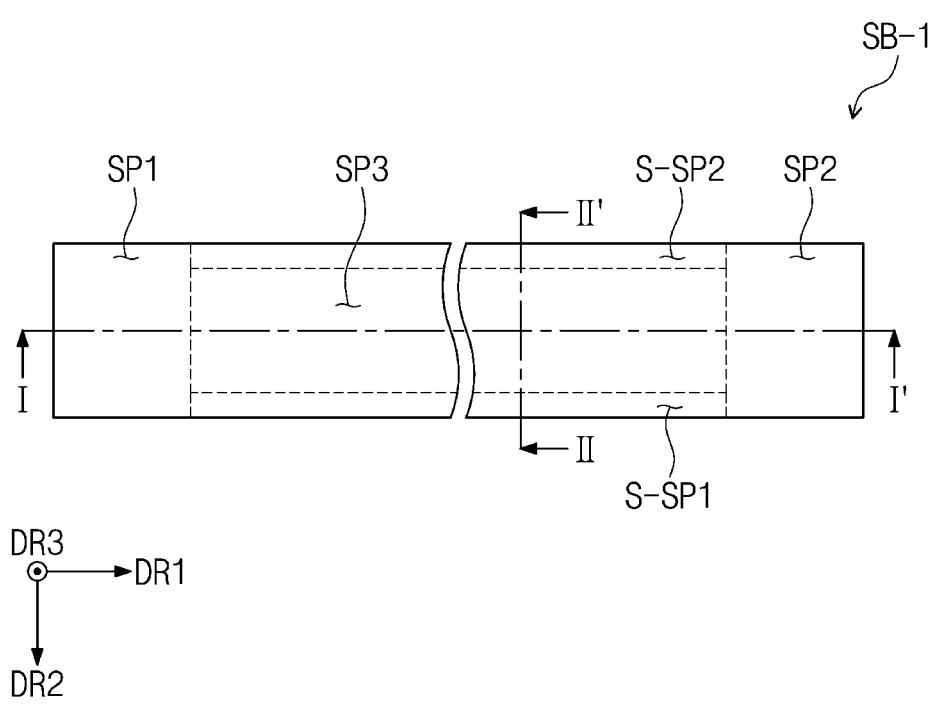
FIG. 9 is a plan view of the support bar according to an embodiment.
Figure 10:
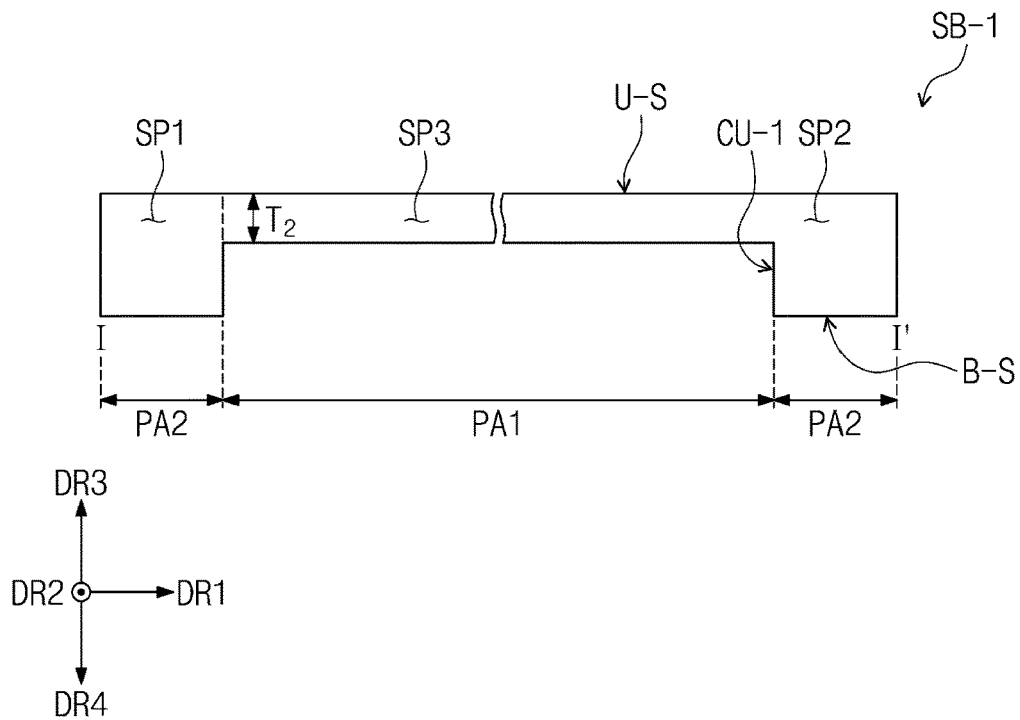
FIG. 10 is a cross-sectional view of the support bar according to an embodiment.
Figure 11:
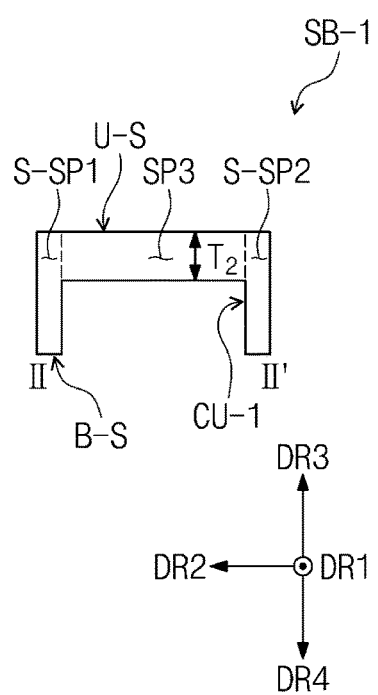
FIG. 11 is a cross-sectional view of the support bar according to an embodiment.
Figure 12:
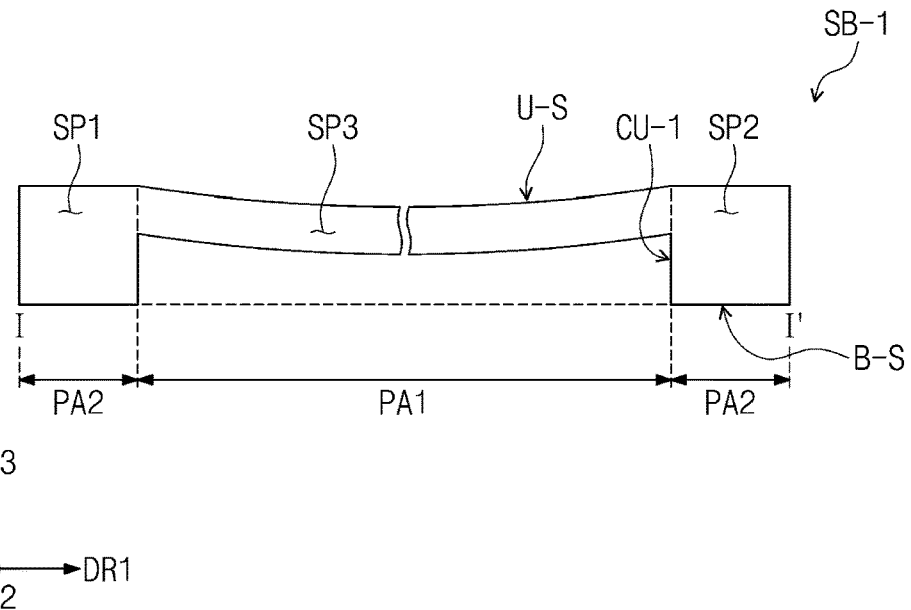
FIG. 12 is a cross-sectional view of the support bar according to an embodiment.
Figure 13:
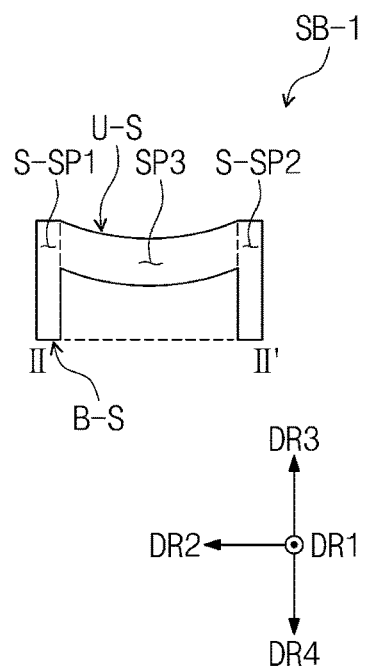
FIG. 13 is a cross-sectional view of the support bar according to an embodiment.

FIG. 8 is a perspective view of the support bar SB-1 according to an embodiment. FIG. 9 is a plan view of the support bar SB-1 according to an embodiment. FIGS. 10 and 13 are cross-sectional views of the support bar SB-1 according to an embodiment. FIGS. 10 and 12 are cross-sectional views of the support bar SB-1, taken along line I-I' of FIG. 9 according to an embodiment. FIGS. 11 and 13 are cross-sectional views of the support bar SB-1, taken along line II-II' of FIG. 9 according to an embodiment. FIGS. 10 and 11 are cross-sectional views illustrating a state before the support bar SB-1 is bent (e.g., is unbent) according to an embodiment. FIGS. 10 and 11 are cross-sectional views illustrating a state after the support bar SB-1 is bent according to an embodiment.

A support bar SB-1 illustrated in FIGS. 8 to 13 is different from the support bar SB described above in FIGS. 1 to 7 in that the support bar SB-1 further includes a first sub support S-SP1 (e.g., first sub support portion) and a second sub support S-SP2 (e.g., a second sub support portion), which are disposed between the second support SP2 and the third support SP3.

Referring to FIGS. 8 to 13, a support bar SB-1 according to an embodiment may further include a first sub support S-SP1 and a second sub support S-SP2. The first sub support S-SP1 and the second sub support S-SP2 may be disposed on the third support SP3, such as being extended from a lower surface of the third support SUP3. The first sub support S-SP1 and the second sub support S-SP2 may define the first portion PA1 of the bottom surface B-S of the support bar SB-1. The first sub support S-SP1 and the second sub support S-SP2 may be disposed to be spaced apart from each other in the second direction DR2. The support bar SB-1 may be closed along the second direction DR2, owing to the first sub support S-SP1 and the second sub support S-SP2, while being open in the fourth direction DR4 owing to the concave portion CU-1.

The support bar SB-1 may include (or define) a top surface U-S and a bottom surface B-S which is opposite to the top surface U-S. The support bar SB-1 may be recessed in a direction from the bottom surface B-S toward the top surface U-S, to define a concave portion CU-1. The concave portion CU-1 may be surrounded by the first support SP1, the second support SP2, the third support SP3, the first sub support S-SP1, and the second sub support S-SP2 together with each other.

The support bar SB-1 according to an embodiment may have a concave portion CU-1 defined recessed from the bottom surface B-S, and thus, an air gap may be provided between the first support SP1, the second support SP2, the third support SP3, the first sub support S-SP1 and the second sub support S-SP2. Therefore, as illustrated in FIGS. 12 and 13, the third support SP3 of the support bar SB-1 may be flexible to be bent. The structure of the support bars SB-1 may be reversibly changed. That is, after being bent as illustrated in FIGS. 12 and 13, the third support SP3 may reversibly return to be restored to the non-bent state as illustrated in FIGS. 10 and 11. Thus, the support bar SB-1 may have elasticity, and the support member including the plurality of elastic support bars SB-1 may have impact resistance.

Figure 14A:
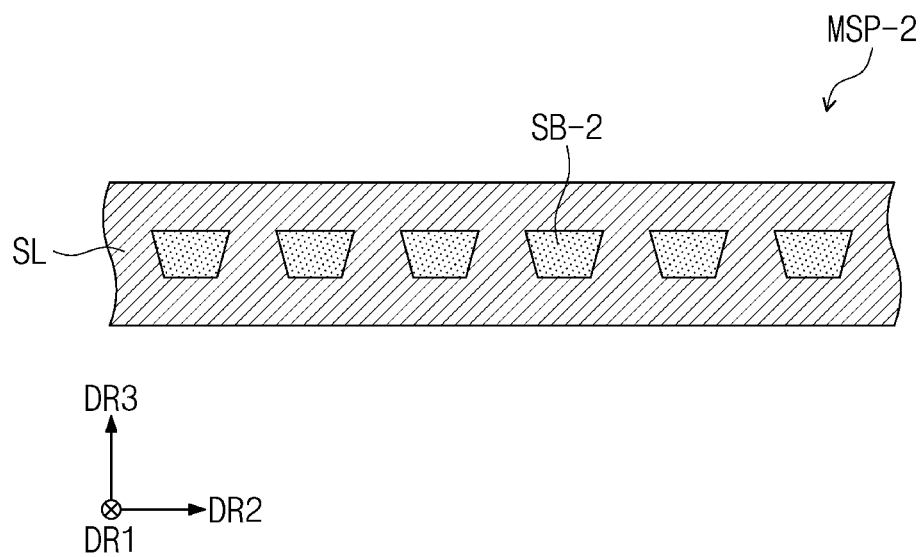
FIG. 14A is a front view of a support member when viewed in a first direction according to an embodiment.
Figure 14B:
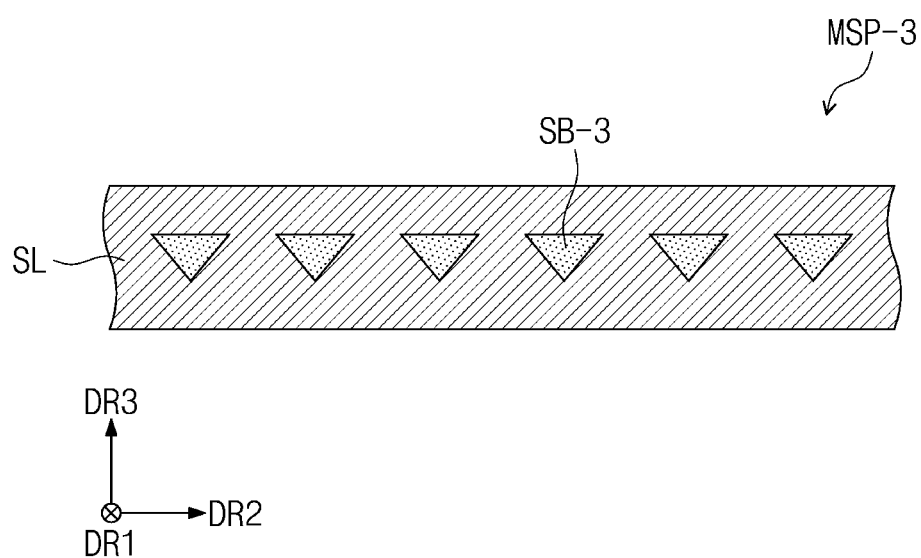
FIG. 14B is a front view of a support member when viewed in the first direction according to an embodiment.
Figure 14C:
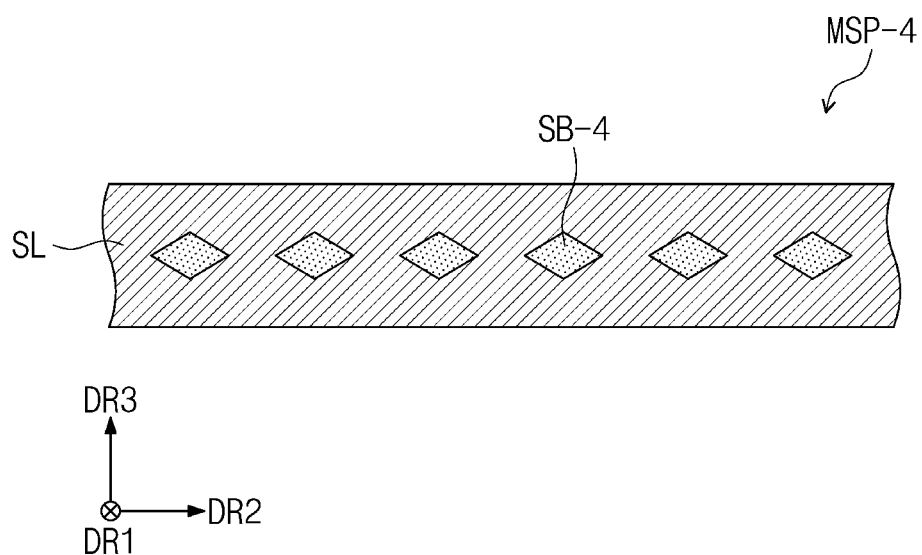
FIG. 14C is a front view of a support member when viewed in the first direction according to an embodiment.

FIGS. 14A to 14C are front views of the support member MSP when viewed in the first direction DR1 according to an embodiment.

A support member MSP illustrated in FIGS. 14A to 14C according to an embodiment is different from the support member MSP illustrated in FIGS. 1 to 8 in that each of the support bars SB has a rhombus shape, an inverted trapezoid shape, or an inverted triangular shape in cross section, where the cross-sectional shape is extended along a length of a support bar SB.

Referring to FIG. 14A, each of support bars SB-2 in the support member MSP-2 may have an inverted trapezoidal shape in the front view when viewed in the first direction DR1. Thus, a width of a top surface of each of the support bars SB-2 in the second direction DR2 may be greater than that of a bottom surface of each of the support bars SB in the second direction DR2. Upper and lower portions of each of the support bars SB-2 may extend in the first direction DR1.

Referring to FIG. 14B, a support member MSP-3 according to an embodiment may include support bars SB-3 having an inverted triangle shape in the front view when viewed in the second direction DR2. A top surface of each of the support bars SB-3 may be parallel to the second direction DR2.

Referring to FIG. 14C, the support member MSP-4 according to an embodiment may include support bars SB-4 having a diamond shape in the front view when viewed in the first direction DR1. The upper and lower portions of each of the support bars SB-3 may extend in the first direction DR1.

The shapes of the support bars SB in the cross-section viewed in the first direction DR1 are not limited to those illustrated in FIGS. 14A to 14C and may have various shapes such as a square shape, a circular shape, an oval shape, and a polygonal shape.

Figure 15:
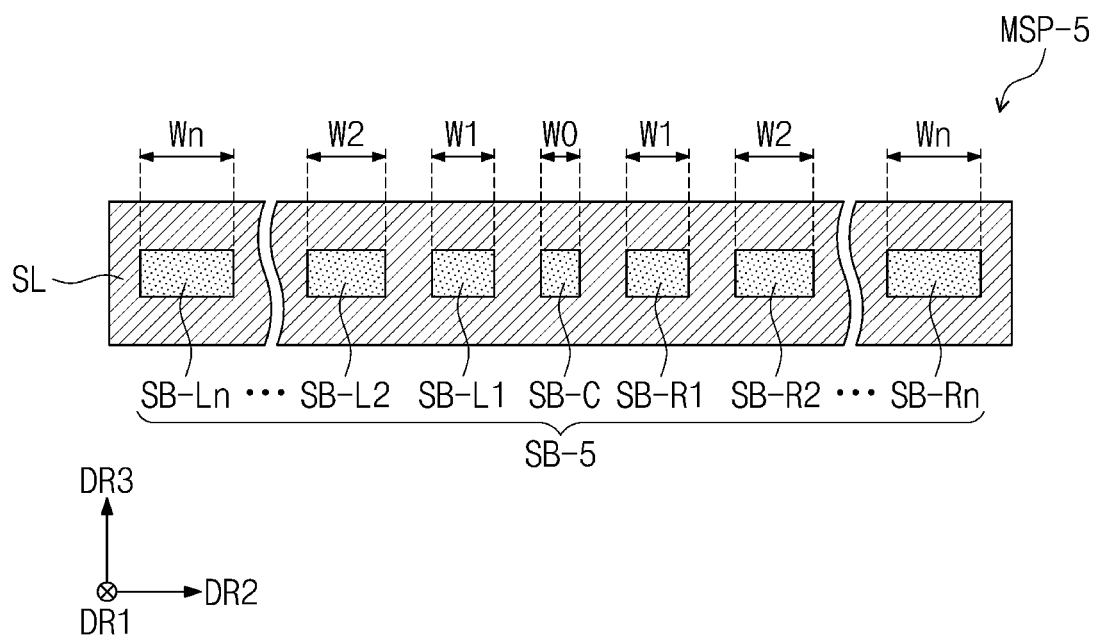
FIG. 15 is a front view of a support member when viewed in the first direction according to an embodiment.

FIG. 15 is a front view of a support member MSP-5 when viewed in the first direction DR1 according to an embodiment.

A support member MSP-5 illustrated in FIG. 15 according to an embodiment is different from the support member MSP illustrated in FIGS. 1 to 8 in that widths of the support bars SB in the second direction DR2 are different from each other.

Referring to FIG. 15, a support member MSP-5 may include support bars SB having different widths from each other, in the second direction DR2. The support member MSP-5 may include a first support bar SB-C, second support bars SB-L1 to SB-Ln, and third support bars SB-R1 to SB-Rn.

The first support bar SB-C may be disposed at a center of the support layer SL, along a width of the support member MSP-5, in the second direction DR2. The first support bar SB-C may have the smallest width W0 in the second direction DR2, among the plurality of support bars SB within the support member MSP-5. The second support bars SB-L1 to SB-Ln may be disposed to be spaced apart from each other and the first support bar SB-C, along a left side relative to from the first support bar SB-C, in the second direction DR2. The third support bars SB-R1 to SB-Rn may be disposed to be spaced apart from each other and the first support bar SB-C, along a right side relative to the first support bar SB-C, in the second direction DR2.

Each of the second support bars SB-L1 to SB-Ln and the third support bars SB-R1 to SB-Rn may include 'n' support bars. The second support bars SB-L1 to SB-Ln and the third support bars SB-R1 to SB-Rn may be symmetrical to each other in the second direction DR2, with respect to the first support bar SB-C. However, an embodiment of the invention is not limited thereto.

The second support bars SB-L1 to SB-Ln may be sequentially arranged to be spaced apart from each other in a direction away from the first support bar SB-C, from a left end of the first support bar SB-C. The first left support bar SB-L1 may be disposed closest to the first support bar SB-C among the second support bars SB-L1 to SB-Ln in the second direction DR2. The third support bars SB-R1 to SB-Rn may be sequentially arranged to be spaced apart from each other in a direction away from the first support bar SB-C, from a right end of the first support bar SB-C. The first right support bar SB-R1 may be disposed closest to the first support bar SB-C among the third support bars SB-R1 to SB-Rn in the second direction DR2.

The first left support bar SB-L1 and the first right support bar SB-R1 may have the same first width W1. The second left support bar SB-L2 and the second right support bar SB-R2 may have the same second width W2. Each of an n-th left support bar SB-Ln of the second support bars SB-L1 to SB-Ln, which is disposed farthest from the first support bar SB-C, and an n-th right support bar SB-Rn of the third support bars SB-R1 to SB-Rn, which is disposed farthest from the first support bar SB-C, may have an n-th width Wn.

Each of the first to n-th widths W1 to Wn may be different from the width W0 of the first support bar SB-C. Each of the first to n-th widths W1 to Wn may be greater than the width W0 of the first support bar SB-C. The width of the plurality of support bars SB may gradually increase from the first width W1 to the n-th width Wn. Thus, the n-th width Wn among the first to n-th widths W1 to Wn may have the largest value, or a maximum value, corresponding to an end side surface of the support member MSP-5. That is, the width of each of the second support bars SB-L1 to SB-Ln and the third support bars SB-R1 to SB-Rn in the second direction DR2 may gradually increase as the support bars are disposed farther away from the first support bar SB-C (e.g., as a distance from the first support bar SB-C increases).

When the display device DD (see FIG. 1B) is rolled, a strain value generated in the support member MSP may increase from both of opposing ends, to the center of the support member MSP, respectively. As the support bar SB having a relatively narrow width is disposed at the central portion of the support member MSP along a rolling direction, strain generated at the central portion of the support member MSP may be reduced.

Although one first support bar SB-C is illustrated in FIG. 5 as an example, an embodiment of the invention is not limited thereto, and the first support bar SB-C may be provided in plurality. Each of the first support bars SB-C may be disposed at a central portion of the support layer SL in the first direction DR1 and may have the smallest width W0 among the support bars SB.

Figure 16:
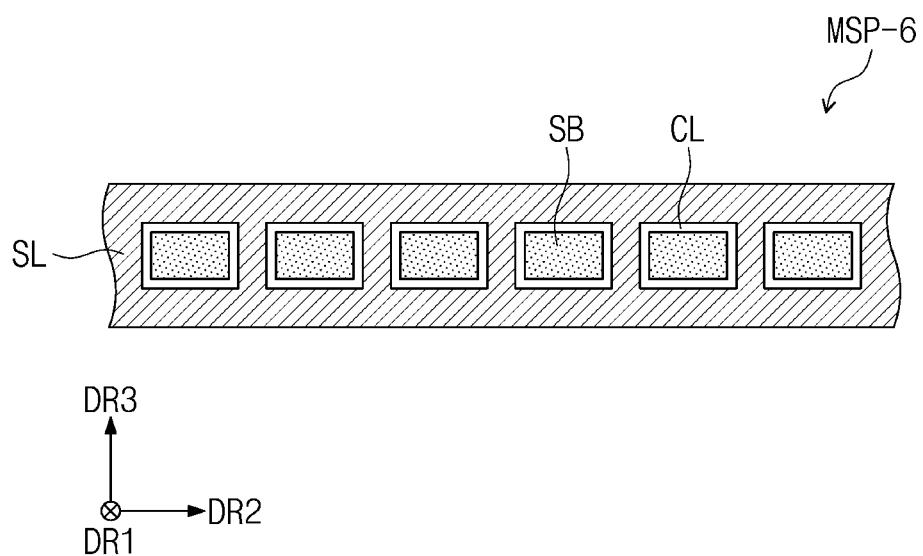
FIG. 16 is a front view of a support member when viewed in the first direction according to an embodiment.

FIG. 16 is a front view of a support member MSP-6 when viewed in the first direction DR1 according to an embodiment.

A support member MSP-6 illustrated in FIG. 16 according to an embodiment is different from the support member MSP illustrated in FIGS. 1 to 8 in that a coating layer CL covering the support bars SB within the support layer SL, is further provided.

Referring to FIG. 16, a coating layer CL covering the support bar SB may be further provided within the support member MSP-6. FIG. 16 illustrates that the coating layer CL is provided as a single layer, but an embodiment of the invention is not limited thereto. For example, the coating layer CL may be provided as a plurality of layers.

The coating layer CL may be covered by the support layer SL. The coating layer CL may be disposed between the support layer SL and the support bar SB in the cross-section. The coating layer CL may be in contact with the support layer SL, such as to form an interface therebetween. FIG. 16 illustrates that both ends of the support bars SB are exposed to the outside of the coating layer CL, at the side surfaces of the support member MSP-6 along the first direction DR1, but an embodiment of the invention is not limited thereto. For example, both ends of the support bars SB may be covered by the coating layer CL and thereby not exposed to outside the support member MSP-6.

The coating layer CL may include a polymer material. For example, the coating layer CL may include at least one of polyimide (PI), polyethylene terephthalate (PET), polycarbonate (PC), and polyamide (PA). However, the material of the coating layer CL is not limited to the above examples.

The coating layer CL may have a predetermined modulus. For example, the coating layer CL may have a modulus of about 100 MPa or more and about 10 GPa or less. The modulus of the coating layer CL may be greater than that of the support layer SL and less than that of the support bar SB.

As the coating layer CL has a value between the modulus of the support layer SL and the modulus of the support bar SB, a deviation in modulus between the support layer SL and the support bar SB may be reduced. As the difference in modulus between the support bars SB and the support layer SL increases, strain generated during rolling of the support member MSP-6 may be concentrated to the support layer SL. Thus, the strain generated in the support bars SB may be reduced, but a maximum value of the strain generated in the support layer SL may increase.

The coating layers CL having the modulus greater than that of the support layer SL and less than that of the support bars SB may respectively over the support bars SB and be disposed inside the support layer SL, and thus, the coating layers CL may absorb the strain generated in the support bars SB. The coating layers CL may reduce the difference in modulus between the components of the support member MSP to minimally maintain the strain generated in the support bars SB and simultaneously reduce the maximum value of the strain generated in the support layer SL. Thus, the support member MSP having enhanced rigidity may be provided to prevent all the support layer SL and the support bars SB from being deformed by the coating layers CL, thereby effectively improving the surface quality of the display device DD (see FIG. 1A).

Additionally, according to this embodiment, the coating layers CL made of the polymer material may be thinly applied on the support bars SB to improve adhesion between the coating layers CL and the support layer SL. The coating layers CL may be disposed between the support bars SB and the support layer SL to improve coupling force between the support bars SB and the support layer SL during the rolling. Therefore, delamination of the support layer SL from the support bars SB may be prevented.

The display device DD according to an embodiment may include the support member MSP including the support bars SB in which the concave portions CU are defined. The air gap may be provided in each of the support bars SB in which the concave portion CU is defined in the thickness direction (e.g., the third direction DR3), and the support bars SB may be reversibly bent by the external impact. Therefore, the display device DD including the support member MSP including the support bars SB according to an embodiment may have excellent impact resistance.

The display device DD according to the embodiment may include the support member MSP including the support bars SB, in which the concave portions CU are defined, respectively, to have the impact resistance.

It will be apparent to those skilled in the art that various modifications and deviations can be made in the invention. Thus, it is intended that the invention covers the modifications and deviations of this invention provided they come within the scope of the appended claims and their equivalents. Accordingly, the technical scope of the invention should not be limited to the contents described in the detailed description of the specification, but should be determined by the claims.

What is claimed is:

1. An electronic device comprising:
    a display module rollable in a rolling direction; and
    a support member facing the display module along a thickness direction of the display module and rollable together with the display module,
    wherein the support member comprises:
        a plurality of support bars arranged along the rolling direction; and
        a support layer which is between the display module and the plurality of support bars,
    wherein each of the plurality of support bars comprises:
        a first support portion and a second support portion at opposing ends of the support bar and facing each other, along a direction crossing the rolling direction and the thickness direction; and
        a third support portion which is between the first support portion and the second support portion, connects the first support portion to the second support portion, and corresponds to the display module,
        wherein a thickness in the thickness direction of each of the first support portion and the second support portion is greater than a thickness in the thickness direction of the third support portion.

2. The electronic device of claim 1, wherein each of the plurality of support bars comprises a metal or a carbon fiber.

3. The electronic device of claim 1, wherein the thickness of each of the first support portion and the second support portion is about 200 micrometers or more to about 1,000 micrometers or less.

4. The electronic device of claim 1, wherein
    each of the first support portion, the second support portion and the third support portion has a length along the direction crossing the rolling direction, and
    the length of the third support portion is greater than the length of each of the first support portion and the second support portion.

5. The electronic device of claim 1, wherein each of the plurality of support bars further comprises a first sub support portion and a second sub support portion which are spaced apart from each other along the rolling direction and connect the first support portion and the second support portion to each other.

6. The electronic device of claim 5, wherein each of the plurality of support bars comprises:
    a top surface closest to the display module, and a bottom surface opposite to the top surface,
    a concave portion recessed toward the top surface, from the bottom surface, and
    the concave portion surrounded by the first to third support portions, together with the first sub support portion and the second sub support portion.

7. The electronic device of claim 1, wherein the support layer comprises an elastic polymer.

8. The electronic device of claim 1, wherein within the support member, the plurality of support bars comprises:
    a first support bar corresponding to a central portion of the support member, along the rolling direction;
    a plurality of second support bars arranged along the rolling direction, from a first side of the first support bar;
    a plurality of third support bars arranged along the rolling direction, from a second side of the first support bar which is opposite to the first side along the rolling direction;
    a width of each of the first support bar, the plurality of second support bars and the plurality of third support bars, defined along the rolling direction; and
    the widths of the plurality of second support bars and the widths of the plurality of third support bars increasing in a direction away from the first support bar, along the rolling direction.

9. The electronic device of claim 1, wherein
    the support member further comprises a coating layer covering the plurality of support bars, the coating layer being between the plurality of support bars and the support layer, and
    a modulus of the coating layer is greater than a modulus of the support layer and is less than a modulus of each of the plurality of support bars.

10. The electronic device of claim 1, wherein a modulus of each of the plurality of support bars is greater than a modulus of the support layer.

11. The electronic device of claim 1, wherein each of the plurality of support bars has a rhombus shape, an inverted trapezoid shape or an inverted triangular shape in a cross-section along the direction crossing the rolling direction.

12. A display device comprising:
    a display module rollable in a rolling direction; and
    a support member facing the display module and rollable together with the display module, the support member comprising a plurality of support bars arranged along the rolling direction and a support layer which covers the plurality of support bars,
    wherein each of the plurality of support bars comprises:
        a top surface closest to the display module;
        a bottom surface opposite to the top surface, the bottom surface comprising:
            a first portion corresponding to the display module, along a direction crossing the rolling direction, and
            a second portion connected to the first portion and adjacent to the display module in the direction crossing the rolling direction, and the first portion together with the second portion defining a concave portion of the support bar which corresponds to the display module and is recessed from the bottom surface.

13. The display device of claim 12, wherein a thickness of each of the plurality of support bars at the second portion is about 200 micrometers or more to about 1,000 micrometers or less.

14. The display device of claim 12, wherein each of the plurality of support bars comprises a metal or a carbon fiber.

15. The display device of claim 14, wherein the support layer comprises a polymer.

16. The display device of claim 12, wherein each support bar among the plurality of support bars further comprises a first sub support portion and a second sub support portion which are spaced apart from each other along the rolling direction and connect the first support portion and the second support portion to each other.

17. The display device of claim 12, wherein within the support member, the plurality of support bars comprises:

a first support bar corresponding to a central portion of the support member, along the rolling direction;

a plurality second support bars arranged along the rolling direction, from a first side of the first support bar;

a plurality of third support bars arranged along the rolling direction, from a second side of the first support bar which is opposite to the first side along the second direction;

a width of each of the first support bar, the plurality of second support bars and the plurality of third support bars, defined along the rolling direction; and the widths of the plurality of second support bars and the width of the plurality of third support bars increasing in a direction away from the first support bar, along the rolling direction.

18. The display device of claim 12, wherein the support member further comprises a coating layer covering the plurality of support bars, the coating layer being between the plurality of support bars and the support layer, and a modulus of the coating layer is greater than a modulus of the support layer and is less than a modulus of each of the plurality of support bars.

19. The display device of claim 12, wherein each of the plurality of support bars has a rhombus shape, an inverted trapezoid shape or an inverted triangular shape in a cross-section along the direction crossing the rolling direction.

20. The display device of claim 12, wherein a modulus of each of the plurality of support bars is greater than a modulus of the support layer.

* * * * *